United States Patent [19]

Volkmann et al.

[11] Patent Number: 4,931,125

[45] Date of Patent: Jun. 5, 1990

[54] METHOD FOR ADHESIVE BONDING WITH PRETREATMENT OF COMPONENTS

[75] Inventors: Curtis L. Volkmann; John J. Kester; Gregory A. Stevens, all of Midland, Mich.

[73] Assignee: The Dow Chemical Company, Midland, Mich.

[21] Appl. No.: 109,669

[22] Filed: Oct. 16, 1987

Related U.S. Application Data

[63] Continuation-in-part of Ser. No. 746,170, Jun. 18, 1985, abandoned, and a continuation-in-part of Ser. No. 876,029, Jun. 18, 1986, abandoned.

[51] Int. Cl.$^5$ .............................................. B32B 31/28
[52] U.S. Cl. ............................... 156/272.8; 156/273.3; 156/275.7; 156/309.9; 156/643; 219/121.64; 219/121.66; 427/53.1
[58] Field of Search ............... 156/643, 644, 535, 153, 156/155, 390, 309.9, 309.6, 308.4, 308.2, 273.3, 275.7, 275.3, 275.1, 272.6, 272.2, 272.8; 427/53.1, 54.1, 55; 219/121 L, 121 LC, 121 LD, 121 LE, 121 LF, 121 LJ, 121 LY, 121 LM, 121 LK, 121 LL, 121 LH, 121.6, 121.63, 121.64, 121.66

[56] References Cited

U.S. PATENT DOCUMENTS

| 3,101,225 | 8/1963 | Cairns | 427/36 |
| 3,193,424 | 7/1965 | Scott | 156/153 |
| 4,599,243 | 7/1986 | Sachdev | 427/41 |
| 4,615,763 | 10/1986 | Gelorme et al. | 156/643 |

FOREIGN PATENT DOCUMENTS 0233755  8/1987  European Pat. Off. .
0085392  of 1984  Japan .

OTHER PUBLICATIONS

John Newbould and Kevin J. Schroeder, General Motors Research Laboratories, "Infrared Laser Surface Treatment of Sheet Molding Compound (SMC) to Promote Adhesive Bonding", presented at American Society for Metals/Engineering Society, Detroit, Advanced Composites Conference in Detroit, Michigan, Sep. 15–17, 1987.

Primary Examiner—Merrell C. Cashion, Jr.
Attorney, Agent, or Firm—Timothy S. Stevens; Wendy B. Buskop; Burke M. Halldorson

[57] ABSTRACT

A method for adhesively bonding a first body to a second body, the first body comprising a non-metallic substrate, such as a piece of rubber, or comprising a non-metallic substrate and a filler therein, such as a piece of fiberglass reinforced plastic, the second body comprising any type of substrate, such as a piece of glass, plastic or metal. The first body is pretreated by placing it in the path of an energy beam, such as a laser beam, to form projections on the non-metallic substrate by evaporation of the non-metallic substrate of the first body, or to expose filler by evaporation of the non-metallic substrate of the first body. The second body can be untreated, pretreated as above or pretreated another way, such as by solvent washing or sandblasting. An adhesive is then coated on the pretreated area of the first body and the first body adhered to the second body. The cured adhesive interlocks with the projections and/or the exposed filler to produce a stronger bond. Similarly, an object, such as a rubber gasket, can be molded to a so-pretreated body so that the cured molding compound interlocks with the projections and/or the exposed filler to produce a stronger bond between the molded object and the so-pretreated body. The invention is also an article made by the method.

28 Claims, 8 Drawing Sheets

Fig. 1

PHOTOMICROGRAPHS OF LASER TREATED SILICONE RUBBER OF EXAMPLE 2

(A)

400X MAGNIFICATION
BEFORE LASER TREATMENT

400X MAGNIFICATION AFTER
OVERLAPPING TREATMENT WITH
1.4 JOULES/$CM^2$ PULSES

PHOTOMICROGRAPHS OF LASER TREATED SILICONE RUBBER OF EXAMPLE 2

400X MAGNIFICATION AFTER OVERLAPPING TREATMENT WITH 5.5 JOULES/CM² PULSES

PHOTOMICROGRAPHS OF LASER TREATED GLASS OF EXAMPLE 4

100X MAGNIFICATION AFTER
OVERLAPPING 160 JOULES $CM^2$ TREATMENT (A)

400X MAGNIFICATION
BEFORE LASER TREATMENT

PHOTOMICROGRAPHS OF LASER TREATED GLASS OF EXAMPLE 4

(D)

4000X MAGNIFICATION AFTER
OVERLAPPING 160 JOULES/CM² TREATMENT

3000X MAGNIFICATION
BEFORE LASER TREATMENT

FIG. 4

PHOTOMICROGRAPHS OF LASER TREATED GRAPHITE FIBER REINFORCED EPOXY COMPOSITE OF EXAMPLE 5

(A) 400X MAGNIFICATION BEFORE LASER TREATMENT (B) 400X MAGNIFICATION AFTER OVERLAPPING TREATMENT WITH 1.4 JOULES/$CM^2$ PULSES

FIG. 5

PHOTOMICROGRAPHS OF LASER TREATED POLYCARBONATE/POLYESTER THERMOPLASTIC BLEND (A) 1500X MAGNIFICATION BEFORE LASER TREATMENT (B) 1500X MAGNIFICATION OVERLAPPING TREATMENT WITH 1.4 JOULES/$CM^2$ PULSES

METHOD FOR ADHESIVE BONDING WITH PRETREATMENT OF COMPONENTS

CROSS-REFERENCE TO RELATED APPLICATION

This application is a continuation-in-part of the copending application Ser. No. 746,170, filed June 18, 1985, herein fully incorporated by reference, and the copending application Ser. No. 876,029 filed June 18, 1986, herein fully incorporated by reference, both now abandoned.

BACKGROUND OF THE INVENTION

The present invention relates to a method for adhesively bonding two bodies together, at least one of which is non-metallic, and articles produced by this method.

A need has long existed for a method of enhancing the adhesive bonding characteristics of various materials by pretreatment of the surfaces of materials to be bonded. This need has extended to enhancing the bonding characteristics of materials which are essentially clean surfaces, e.g., solvent cleaned surfaces, as well as enhancing the bonding characteristics of contaminated surfaces, e.g., surfaces covered with a protective coating such as a wax or oil coated surface. These needs have developed, for example, out of the automotive and aircraft industries dissatisfaction with current pretreatment techniques and bonding results.

Prior techniques for enhancing the bonding characteristics of non-metallic bodies include sandblasting, shot peening, brushing, and washing with solvents. See, for example, "Adhesives Technology Handbook," A. H. Landrock, 1985, Noyes Publications, ISBN 0-8155-1040-3. All of these techniques have undesirable features such as waste disposal of spent chemicals. Nevertheless, surface treatment usually results in enhanced bondability.

In U.S. Pat. No. 3,600,289 to Bragole, a surface treatment, prior to adhesive bonding, for polymer substrate bodies is described comprising irradiating the polymer substrate with ultraviolet light in order to chemically modify the polymer surface. The chemically modified surface coacted beneficially with selected adhesives to enhance bond strength.

In U.S. Pat. No. 4,615,763 to Gelorme et al., a surface treatment, prior to adhesive bonding with a photosensitive adhesive, for filled polymer substrate bodies is described comprising etching the polymer in a plasma. The etched surface coacted beneficially with the photosensitive adhesive to enhance bond strength.

SUMMARY OF THE INVENTION

The invention in one aspect is a method for adhesively bonding a first body to a second body, the first body having a non-metallic substrate such as a synthetic or natural polymer substrate or a ceramic substrate. The method comprises the steps of pretreating an area of the first body, contacting the pretreated area of the first body with an adhesive agent or contacting an area of the second body with an adhesive agent or contacting the pretreated area of the first body and an area of the second body with an adhesive agent, the area of the second body being pretreated or non-pretreated, and then joining the first body with the second body so that the adhesive agent is interposed between the pretreated area of the first body and the area of the second body. The improvement of this aspect of the invention comprises as the step of pretreating an area of the first body, the step of placing the first body in the path of an energy beam having a selected energy density for a duration effective to form projections on the non-metallic substrate of the first body, the projections formed by evaporation of the non-metallic substrate of the first body. The invention in another aspect is also an article made by the method of this paragraph.

The invention in another aspect is a method for adhesively bonding a first body to a second body, the first body comprising a non-metallic substrate and a filler therein such as fiber reinforced plastic. The method comprises the steps of pretreating an area of the first body, contacting the pretreated area of the first body with an adhesive agent or contacting an area of the second body with an adhesive agent or contacting the pretreated area of the first body and an area of the second body with an adhesive agent, the area of the second body being pretreated or non-pretreated, and then joining the first body with the second body so that the adhesive agent is interposed between the pretreated area of the first body and the area of the second body. The improvement of this aspect of the invention comprises as the step of pretreating an area of the first body, the step of placing the first body in the path of an energy beam having a selected energy density for a duration effective to expose the filler of the first body by evaporation of the non-metallic substrate of the first body. The invention in another aspect is also an article made by the method of this paragraph.

The invention in another aspect is a method for molding an object, such as a rubber gasket, to a body having a non-metallic substrate, such as synthetic or natural polymer or a ceramic. The method comprises the steps of pretreating an area of the non-metallic substrate of the body, contacting the body with a mold, the mold having a chamber at least partially defining the shape of the object to be molded to the body, at least a portion of the pretreated area of the non-metallic substrate of the body exposed to the chamber, filling the mold with uncured molding compound so that the uncured molding compound contacts the walls of the mold and at least a portion of the pretreated area of the non-metallic substrate of the body, curing the molding compound in the chamber so that an object is molded to the body, the improvement which comprises as the step of pretreating an area of the non-metallic substrate of the body. The improvement of this aspect of the invention comprises placing the body in the path of an energy beam having a selected energy density for a duration effective to form projections on the non-metallic substrate of the body, the projections formed by evaporation of the non-metallic substrate of the body. The invention in another aspect is an article made by the method of this paragraph.

The invention in another aspect is a method for molding an object, such as an epoxy resin flange, to a body having a non-metallic substrate and a filler therein such as fiber reinforced plastic. The method comprises the steps of pretreating an area of the non-metallic substrate of the body, contacting the body with a mold, the mold having a chamber at least partially defining the shape of the object to be molded to the body, at least a portion of the pretreated area of the non-metallic substrate of the body exposed to the chamber, filling the mold with uncured molding compound, such as uncured two part epoxy resin, so that the uncured molding compound contacts the walls of the mold and at least a portion of the pretreated area of the non-metallic substrate of the body, curing the molding compound in the chamber so that an object is molded to the body. The improvement of this aspect of the invention comprises placing the body in the path of an energy beam having a selected energy density for a duration effective to expose a portion of the filler of the body by evaporation of the non-metallic substrate of the body. The invention in another aspect is an article made by the method of this paragraph.

DETAILED DESCRIPTION OF THE INVENTION

Figure 1:
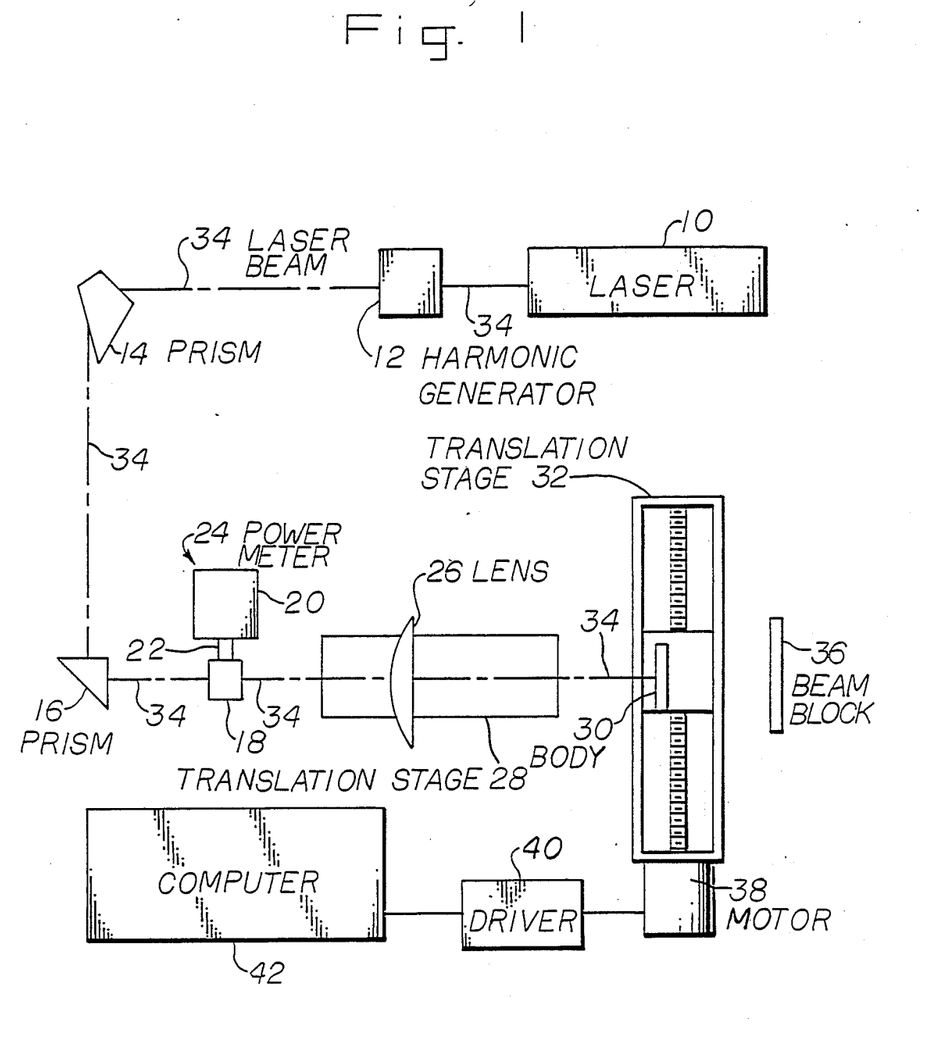
FIG. 1 shows an apparatus useful for the method of the invention.

An apparatus useful for modifying surfaces to be bonded according to the method of the invention is typically illustrated in FIG. 1 and involves a laser 10 and means 14, 16 and 26 for guiding the beam from the laser to the surface of the object to be treated. One preferred laser 10 is a Q-switched Nd:YAG laser. Other lasers which are preferred include gas lasers, $CO_2$ lasers, and excimer lasers. The Kirk-Othmer "Encyclopedia of Chemical Technology," Third Edition, Volume 154, pages 42–81, John Wiley & Sons, New York (1979), describes various types of lasers and their uses. The apparatus of the invention may also comprise one or more lasers or a laser with beam splitting means adapted for the purposes of the invention.

The beam 34 issuing from laser 10 can be altered by a harmonic generator 12 capable of reducing the wavelength of the beam proportional to a selected integral factor, and optical components, such as a prism 14 to spacially separate differing frequencies of the laser beam, a right-angle prism 16, and a preferred cylindrical focusing lens 26 which focuses the laser beam onto a surface to be treated 30 and results in a generally elliptical shaped area of surface treatment at any one time. The length of said ellipse is determined by the diameter of the laser beam and can be made longer by placing a diverging lens, not shown, in the laser beam 34 as is well known in the art. The dotted line 34 between laser 10 and lens 26 can further represent an optical fiber for directing the beam 34 at the surface to be treated.

A power meter 24 can be disposed between the right-angle prism 16 and the focusing lens 26. The power meter essentially has two parts, a detector head 18 integrally connected by means 22 with a conventional analog readout meter 20. The detector head 18 can be placed in the path of the laser beam to detect the average power of the laser beam.

The cylindrical focusing lens 26 is disposed on a translation stage 28. The translation stage 28 includes a track for moving the lens 26 parallel to the path of the beam to focus and defocus the beam at the sample surface 30 to be treated. The translation stage 28 can be manually operated or operated by robotic means or by a motor.

The body to be pretreated 30 is disposed on a sample translation stage 32. The body 30 critically has a non-metallic substrate, e.g., consists essentially of non-metal such as a synthetic resin polymer, a natural resin polymer, or a polymer filled with a reinforcing agent, or ceramics such as glass. The body 30 is moved on the translation stage 32 relative to the beam 34. Preferably, the body 30 is moved perpendicular to the beam 34. The translation stage 32 can be operated by a stepping motor 38 or, alternatively, by a robotic means or by manual means (not shown). Preferably the translation stage 32 is a controlled X-Y translational stage or a combination translation stage-rotating wheel. Such items are easily available commercially, for example, from Velmex Company in Bloomfield, N.Y. Other means of moving the energy beam relative to the surface to be treated can include optical fibers attached to robot arms that have 2–6 degrees axis of freedom or industrial grade X-Y-Z gantry style platforms with or without mirrors to distribute the beam. When mirrors are used, they themselves can be made to move and rotate, thereby economically moving the laser beam. Such mirrors are often referred to as scanning mirrors. It is convenient to control translation stage 32 with a driver 40 which in turn is operated by a computer 42. The computer 42 can easily control the number of pulses per area or the treatment duration when using a continuous wave laser on the body 30 and the amount of overlap between successive areas treated may be easily regulated. As long as the energy density for treating the surface is maintained, the relative movement between the laser beam path and the surface to be treated can be as fast as possible. Preferably, each area treated overlaps at least somewhat with the area treated previously. In many embodiments of the invention where there is a visible change in the surface resulting from the laser treatment, it is preferable that there is an overlap of the visibly affected areas from those areas previously treated. Once the body 30 has passed through the beam 34, a beam block 36 can be used to trap the beam 34. The invention can also incorporate more than one energy beam, e.g., two or more lasers. The term "energy beam" refers to one or more electromagnetic radiation beams and/or one or more particle beams. An example of a particle beam believed to be useful in this invention is an electron beam.

The energy beam or beams can be site-specific, that is, focused on a selected area of a surface, such as a rubber surface with a high degree of accuracy to insure that the beams do not affect the appearance and/or other characteristics of neighboring surface areas, namely, of areas which do not require any treatment or whose treatment is already completed. The amount of energy transferred to an area of surface may be controlled by focusing or defocusing the energy beam, controlling the exposure time of the beam and adjusting the output power of the energy beam source. The vaporized non-metallic may be easily exhausted from the treatment area using conventional exhaust, so as not to affect the health and/or comfort of the attendants and not to contribute to the pollution of the surrounding atmosphere.

The energy beam source must satisfy certain criteria. The first criterion is that the energy beam source must be capable of producing an extremely high energy density at the surface to be treated. For this invention, the critical parameter is absorbed energy rather than incident energy. However, absorbed energy is difficult to quantify and for the case where a laser is used as the beam source, the proportion of energy absorbed varies widely, with differences in the material to be treated and the condition of the surface to be treated. The second criterion is that the absorbed energy must be converted into sufficient thermal energy to vaporize the non-metallic substrate itself to form projections (and the term "projections" includes the formation of pits) on the non-metallic substrate, such as a polymer, and/or for filled non-metallic substrates, such as fiberglass reinforced polymer or calcium carbonate filled polymer, to expose the filler, such as exposing glass fibers, by evaporation of the non-metallic substrate. The projections are often in the micron size range as shown in the examples below. The third criterion is that the energy beam applied to any specific area of the non-metallic substrate body must be applied for a relatively short time to control the depth of vaporization of the non-metallic substrate, e.g., to prevent burn through of the non-metallic substrate.

Using either a pulsed laser or a continuous wave laser, or a plurality of lasers, the exposure time of the laser onto the body may be used to control the amount of energy directed to the surface of the body. The optimal exposure time and energy content of the energy beam depends upon the composition of the surface of the body, the shape of the surface of the body, the surface roughness of the body, the movement of the surface of the body relative to the beam, the angle the beam strikes the surface of the body, the type of laser being used, and on the ultimate application desired for the body being treated.

The preferred type of laser used in the invention depends on the specific application. Among the preferred lasers are carbon dioxide lasers and Q-switched Nd:YAG lasers. The carbon dioxide lasers are believed to be among the most promising to scale up this invention because of the commercial availability of carbon dioxide lasers with power outputs well above 5 kilowatts. It is believed that an excimer laser is also preferred.

Generally when a longer pulse time laser is used, the amount of laser energy focused onto a given area of the body per pulse needs to be increased. When using a laser having a pulse time between 1 and 100 nanoseconds, preferably the energy density of each laser pulse is in the range of from 0.005 to 100 joules/cm$^2$, and more preferably in the range of from 0.05 to 10 joules/cm$^2$ per pulse. When using a pulsed laser having a pulse time between 100 and 10,000 nanoseconds, preferably the energy density of each laser pulse is in the range of from 0.05 to 1,000 joules/cm$^2$ per pulse and more preferably in the range of from 0.5 to 100 joules/cm$^2$ per pulse. When using a laser having a pulse time between 10 and 1,000 microseconds, preferably the energy density of each laser pulse is in the range of from 5 and 10,000 joules/cm$^2$ per pulse and more preferably from 50 to 1,000 joules/cm$^2$ per pulse. When using a laser having a pulse time between 1 and 100 microseconds, preferably the energy density of each laser pulse is in the range of from 5 to 10,000 joules/cm$^2$ per pulse and more preferably from 50 to 1,000 joules/cm$^2$ per pulse. Similarly, when using a pulsed laser having a pulse time of 0.1 nanoseconds, it is believed that the preferred energy density of each laser pulse is in the range of from about 0.001 to about 5 joules/cm$^2$, and more preferably from 0.01 to 1 joules/cm$^2$ per pulse. When using a continuous wave laser, the relative rate of movement between the laser beam and the surface of the body to be treated, i.e., pretreated, and the intensity of the beam need to be controlled to similarly achieve beneficial modification. When using a continuous wave laser and a duration of treatment between 0.1 and 10 milliseconds, preferably the energy density is between 5 and 10,000 joules/cm$^2$ per duration time, and more preferably between 50 and 1,000 joules/cm$^2$ per duration time. When using a continuous wave laser and a duration of treatment between 10 and 1,000 milliseconds, preferably the energy density is between 10 and 20,000 joules/cm$^2$ per duration time and more preferably between 100 and 2,000 joules/cm$^2$ per duration time. When using a continuous wave laser and a duration of treatment between 0.001 and 0.1 millisecond, preferably the energy density is between 0.5 and 1,000 joules/cm$^2$ per duration time and more preferably between 5 and 100 joules/cm$^2$ per duration time. When using a continuous wave laser and a duration of treatment between 0.01 and 1 microsecond, preferably the energy density is between 0.05 and 1,000 joules/cm$^2$ per duration time and more preferably between 0.5 and 100 joules/cm$^2$ per duration time.

The determination of joules/cm$^2$ per pulse is made by interrelating two measurements. The first measurement is a determination of the specific laser beam energy per laser beam pulse. This measurement includes the use of a laser optical power meter as is well known in the art. Generally, laser power meters show the average power of the laser beam in average watts. The number of average watts reported by the laser power meter is divided by the number of laser beam pulses per second to obtain the number of joules per pulse. The pulse time is that time over which about 66 percent of the beam energy is emitted by the laser. The second measurement is a determination of the area on the surface to be modified that is impacted by the laser beam. This measurement is made by placing Zap-It brand laser thermal sensitive paper (Kentek Inc., Manchester, N.H.), or an equivalent paper, on the surface to be treated followed by examination of the resulting visible effect of a single laser pulse. An envelope is drawn around the visibly affected area of the pulse and the area of the envelope is calculated as is well known in the art of geometry. Finally, the number of joules per pulse is divided by the affected area in cm$^2$ to obtain the joules/cm$^2$ per pulse.

The determination of joules/cm$^2$ per unit of treatment time for any one point using a continuous wave laser is made by interrelating two measurements. The first measurement is a determination of the laser beam power per cm$^2$. Using a laser optical power meter, the number of watts reported is divided by the area of the surface treated by the laser at any one time as determined above to obtain watts per cm$^2$. The second measurement is a calculation of the duration of exposure of any one point. The width of the treated area in cm at any one time in the direction of surface movement relative to the laser beam is divided by the relative movement velocity in cm per second. Then the watts per cm$^2$ is multiplied by the treatment duration to obtain the joules/cm$^2$ per unit of treatment duration.

In some applications it is desirable to pretreat only one of the two bodies to be bonded with the method of the present invention. For example, when bonding dissimilar bodies, one body may require pretreatment to enhance its performance to a level approximately equal to the other body not so-treated. Additionally, it is sometimes desirable to modify only one surface of a body to predispose a bond to fail in a predictable and beneficial manner not unlike the desire for rolled cellophane adhesive tape to come off its roll with the adhesive layer bonded to only one side of the cellophane.

The invention can be used to bond different materials where both surfaces are treated. As an example, bonding rubber to aluminum.

The specific adhesive agent used, e.g., a conventional adhesive formulation such as a two part epoxy resin adhesive, is not critical in the invention as long as said adhesive agent coacts with the non-metallic substrate body pretreated according to this invention to produce an enhanced bond to the other body relative to the bond produced with no pretreatment of the two bodies to be bonded. It is believed that the adhesive agent, when cured, interlocks with the projections and/or exposed filler produced by the present invention as above described. Specifically, the enhanced bond will show at least one of the following enhanced properties (and again relative to the bond produced with no pretreatment of the two bodies to be bonded): at least a 20 percent stronger bond as demonstrated by a standard lap shear test a more durable bond upon exposure to moisture as demonstrated by at least a 25 percent shorter crack extension in a modified standard crack extension wedge test a stronger bond as demonstrated by at least a 25 percent shorter initial crack in a modified standard wedge test at least a 20 percent higher pull strength as demonstrated by the ASTM 1876-72 peel test at least a 20 percent higher impact strength as demonstrated by a modified ASTM D-256-81 impact test at least a 25% longer time of immersion in boiling water before debonding in the test of Example 4; at least a 20 percent higher torque strength using the torque test of Example 4: or at least a 25 percent reduction in the area of bond failure at the interface between the adhesive and the bonded surface in any of the tests above with a commensurate increase in failure within the adhesive itself or in the bonded material. Preferred adhesives which work within the scope of the invention include urethanes, acrylics and epoxies. Other adhesives which work within the scope of the invention include silicone adhesives, cyanoacrylates and thermoplastic hot melts like polyimides. Alternatively, other hot melts and solvent borne thermoplastic adhesives are believed to work within the scope and teaching of the present invention, as are blends and hybrids of the various types of adhesives mentioned.

The specific curing conditions for the adhesive used in the invention are not critical. Generally, the curing conditions are recommended by the manufacturer of the adhesive for a given application. Preferably, the adhesive is applied to the modified surface with a minimum of delay in time. However, tests indicate that when a modified surface was kept covered (in a drawer), enhanced bonding performance was observed even when the adhesive was applied one week and often over 2 months later after surface modification, because the projections and/or exposed filler formed often appear very stable.

With respect to the temperature at which enhanced bonding is proved by lap shear or wedge testing, said testing is generally done at room temperature but can also be done at temperatures higher or lower than room temperature, e.g., at 180° F. or at 0° F.

Urethane based adhesives are well known and widely used to adhere plastic and/or metal adherends together. The choice of urethane adhesives over other adhesives is based in part upon their outstanding characteristics with respect to bond strength, chemical inertness, tensile strength and handling characteristics.

One component of a urethane based adhesive generally is an isocyanate-terminated prepolymer compound. Such a compound is normally prepared by reacting a polyisocyanate with a polyhydroxy compound or other compound containing labile hydrogen atoms that will give a positive Zerewitinoff test. The isocyanate group reacts with the labile hydrogen atom to form a urethane group. A molar excess of the isocyanate is added so that the resulting compound contains free isocyanate groups.

The other component of the urethane based adhesive is generally a cross-linking mixture comprising an admixture of polyhydroxy compound free of isocyanate groups and selected urethane catalysts. When the two components are admixed, for example, in a high shear mixing head and then applied to a surface, a reactive hydrogen can interact with a free isocyanate group chain extended and cross-linked with an isocyanate-terminated prepolymer to form a cured adhesive.

Other adhesives which work within the scope and teachings of the present invention include epoxy adhesives. A variety of epoxy adhesives work within the scope of the present invention including those which are rapidly curable at elevated temperatures and especially adapted for use on automotive assembly lines to adhesively bond metal and/or polymeric parts. Numerous types of epoxy adhesives exist on the market, such as the epoxy described in U.S. Pat. Nos. 4,459,398; 4,467,071; and 4,485,229. Epoxides and epoxy resins which have increased adhesive strength contemplated for use within the present invention include epoxy resin formulations which are either pure or contain additives which enhance the properties of the epoxy resin. Exemplary enhanced epoxy resin compositions include those described in U.S. Pat. Nos. 4,002,598; 4,011,281; 4,139,524; 4,146,701; 4,147,857; 4,178,426: and 4,219,638. Curable epoxy resins which are polymerized by ionic addition mechanisms and often require high curing temperatures and long setting times can be used within the scope and teachings of the invention. Essentially, any epoxy adhesive capable of forming a tight polymer network, characterized by durability, good adhesion, good water, chemical and/or heatresistant qualities can be used within the scope of the invention.

Additionally, combinations of epoxies and acrylic-based adhesives can be used. For example, the adhesive described in U. S. Pat. No. 3,684,617 dealing with an adhesive mixture of acrylic-based monomer and epoxy resin can be used within the scope of the invention. Also, a nonreactive composite adhesive described in U.S. Pat. No. 3,994,764 may be used within the scope of the invention.

Acrylic adhesives can work within the scope and teachings of the present invention. Acrylic adhesives which include polymers and copolymers formed from acrylic and methacrylic acids and their derivatives can be applied to the laser treated surface and provide the enhanced bonding properties. It is anticipated that a variety of other adhesives will also have utility within the defined invention. These adhesives include carboxylic polymeric adhesives, polysulfide adhesives, phenolic resin adhesives, amino resin adhesives, ethylene copolymer based hot melt adhesives, polyvinyl acetal adhesives, anaerobic adhesives, polyamide adhesives and polyethylenimine based adhesives.

These adhesives can optionally contain other materials. Other optional ingredients which can be added to either component include thickeners, stabilizers, flame retardants, metal particles, fibers, fillers, thixotropes and the like. The adhesives which are usable within the scope and teachings of the present invention can be prepared by a variety of methods, e.g., one and/or two-part components using a variety of curing processes.

Adhesive materials can in some cases by used in conjunction with a primer as is well known in the art. Here and in the claims such primers are considered to be adhesive agents.

The adhesive coating disposed on the surface of the material and treated in accordance with the inventive method, can form a more durable bond, as well as a stronger bond.

The pretreatment step of the present invention can be carried out in alternative environments, such as a protective atmosphere composed of nitrogen, or alternatively, an environment containing an inert gas, such as argon or alternatively in an environment containing a reactive gas such as hydrogen. It is contemplated that the inventive method could be practiced in an atmosphere containing a mixture of gases which would enhance the treatment of the surface for enhanced bonding.

Another embodiment of the present invention is to mold an object, such as a rubber gasket, to a body pretreated as for adhesive bonding as described above. It is believed that the cured molding compound, such as cured rubber, interlocks with the projections and/or exposed filler, such as a fiber reinforcing filler such as fiber glass or graphite fibers, to produce a stronger bond between the object and the pretreated body. The specific molding compound used is not generally critical to the invention as long as it is moldable in its uncured state and includes thermoset and thermoplastic resins as well as casting resins such as epoxy and polyester resins. Elastomers believed useful in this aspect of the invention include natural and synthetic rubbers (including silicone rubbers). The term "uncured" means not yet effectively cross-linked or for non-cross-linked elastomers (for example, TPO rubbers) the term "uncured" means that the elastomer is heated sufficiently so that it is fluid and moldable.

The novel features which are considered as characteristic of the invention are set forth in particular in the appended claims. The apparatus for the practice of the method, both as to its construction and its mode of operation, together with additional features and advantages of the method will be better understood upon perusal of the above detailed description of certain specific embodiments with reference to the accompanying drawings and upon study of the following examples and comparative examples.

EXAMPLE 1

The apparatus for treating, i.e., pretreating, a nonmetallic substrate body for enhanced adhesion includes a Q-switched Quanta-Ray Nd:YAG Model No. DCR-2 laser which produces 30 pulses per second. The laser produces radiation at a wavelength of 1.06 microns with a maximum average power of about 18 watts.

The laser beam is directed at the body to be treated by a system of optical components. The components route and focus the beam. The components are constructed of high quality quartz, S1-UV grade. The beam is directed by 90 degree prisms ESCO Model No. 1125250 and focused to a line image about $\frac{1}{2}$ inch long by a cylindrical 50 cm focal length lens, ESCO Model No. B1-20100.

The bodies to be treated, 1×4 inch sheet molding compound (SMC) panels (calcium carbonate/glass fiber filled polyester resin containing zinc stearate as a mold release agent) $\frac{1}{8}$ of an inch thick, are placed in a holder on a translation stage synchronized with the laser pulse repetition rate and translated through the beam. The translation apparatus includes a Velmex Unislide A4000 series translation stage. The slide of the translation apparatus is driven by a stepping motor from Superior Electric, Model No. M061-FD08. The stepping motor is controlled by a Superior Electric Model No. STM 103 controller and the controller is operated by a Commodore 64 computer for complex maneuvers or manually operated.

The panels are translated through the laser beam path at 16 mm/sec and the final $\frac{1}{2}$ inch portion of each panel is treated. The lens to panel distance is 35 cm. The laser energy density is 0.6 joules/cm$^2$ per pulse to expose glass fibers and calcium carbonate filler by evaporation of the polyester substrate.

The panels are bonded between the treated areas with Hardman red/white two-part acrylic adhesive, containing 0.5 percent, 0.020 inch diameter glass beads, cured according to label directions and the lap shear strength of the bond measured using ASTM test D-1002. Polymer panels bonded without laser treatment have bond strengths of about 100 psi. The laser treated panels show a lap shear strength of about 500 psi.

Figure 6:
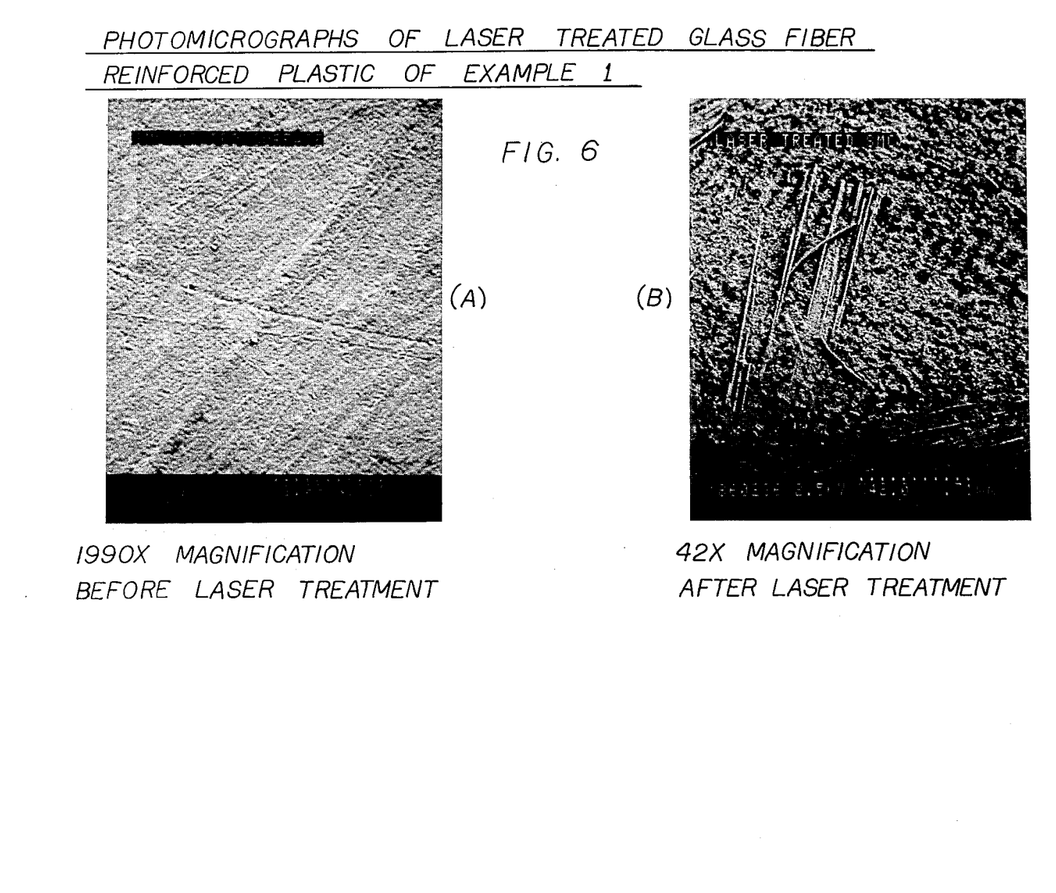
FIG. 6A–6B show photomicrographs of laser treated glass fiber reinforced plastic of Example 1.

FIG. 6(a) and 6(b) show electron photomicrographs of the fiber reinforced polyester SMC panels: 6(a) before laser treatment at 1990 X magnification; and 6(b) after overlapping treatment with 0.6 joules/cm$^2$ pulses at 42 X magnification showing glass fibers exposed on one side by the evaporation of the polyester resin substrate while the other side of the fibers remain embedded in the polyester resin substrate. In addition, FIG. 6(b) also shows projections in the polyester resin substrate formed by evaporation of the polyester resin substrate.

In addition, 1×4 inch panels of acrylonitrile-butadiene-styrene (ABS) plastic sheet, 1/16 inch thick, are laser treated as above to form projections on the ABS substrate, the projections formed by evaporation of the ABS substrate, and then bonded with Hardman red/white two-part acrylic adhesive cured at room temperature, containing 0.5 percent, 0.020 inch diameter glass beads, cured according to label directions. The lap shear strength of the laser treated panels is so high that the panels themselves break in testing at about a lap shear strength of 900 psi and for comparison the lap shear strength of the panels bonded without laser treatment is about 400 psi.

EXAMPLE 2

The system of Example 1 is used to treat detergent washed panels of Duro Inc. 50A red silicone rubber to form projections on the rubber substrate, the projections formed by evaporation of the rubber substrate. The test panels are 1×4×$\frac{1}{8}$ inch. The treated panels are then bonded together with 3M Scotch-Weld No. 2216 B/A flexible adhesive (3 parts "A" to 2 parts "B" by volume) cured 1 hour at room temperature and 1 hour at 180° F. and then subjected to the ASTM D-1876-72 peel test (see Table I).

TABLE I
PEEL TESTING OF LASER TREATED SILICONE RUBBER PANELS BONDED TOGETHER WITH SCOTCH-WELD ADHESIVE

| Laser Energy Density, Joules/cm$^2$ per Pulse | Peel Strength Pounds per Linear Inch |
| --- | --- |
| 0.0 | 0.1 |
| 1.35 | 8.3 |
| 5.5 | 13.6 |

The data in Table I indicate that the bond strength as indicated by the peel test was significantly improved after laser treatment.

Figure 2:
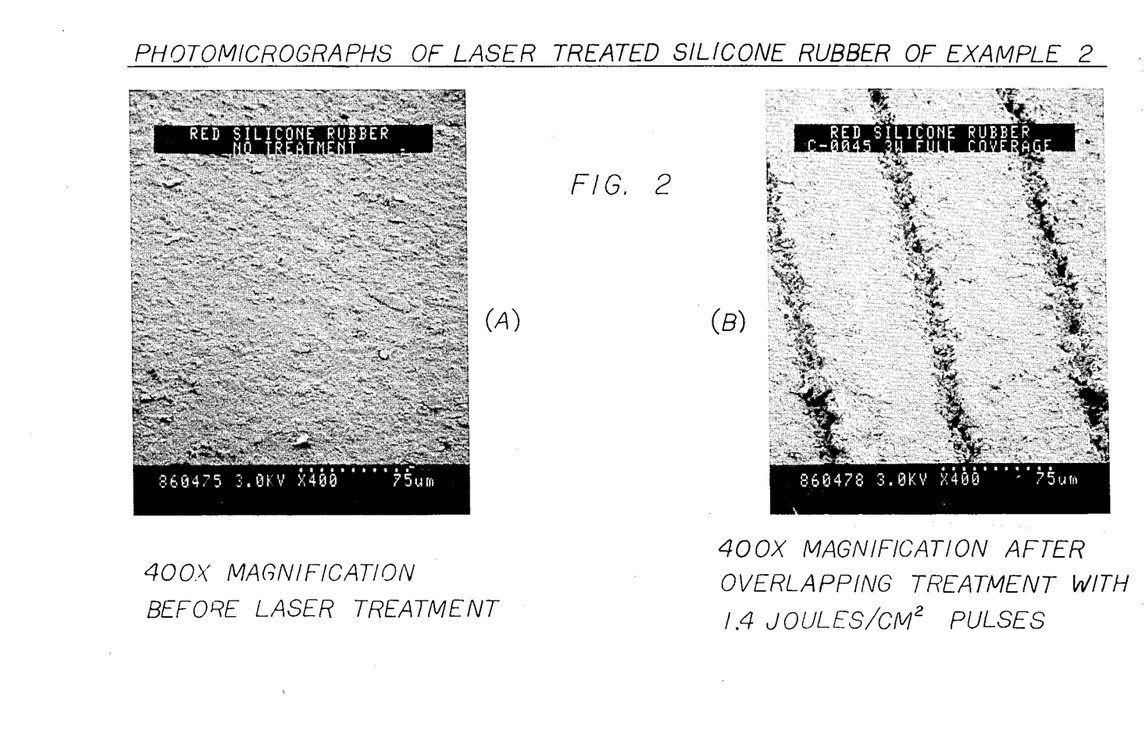
FIG. 2A–2C show photomicrographs of laser treated silicone rubber of Example 2.
Figure 3:
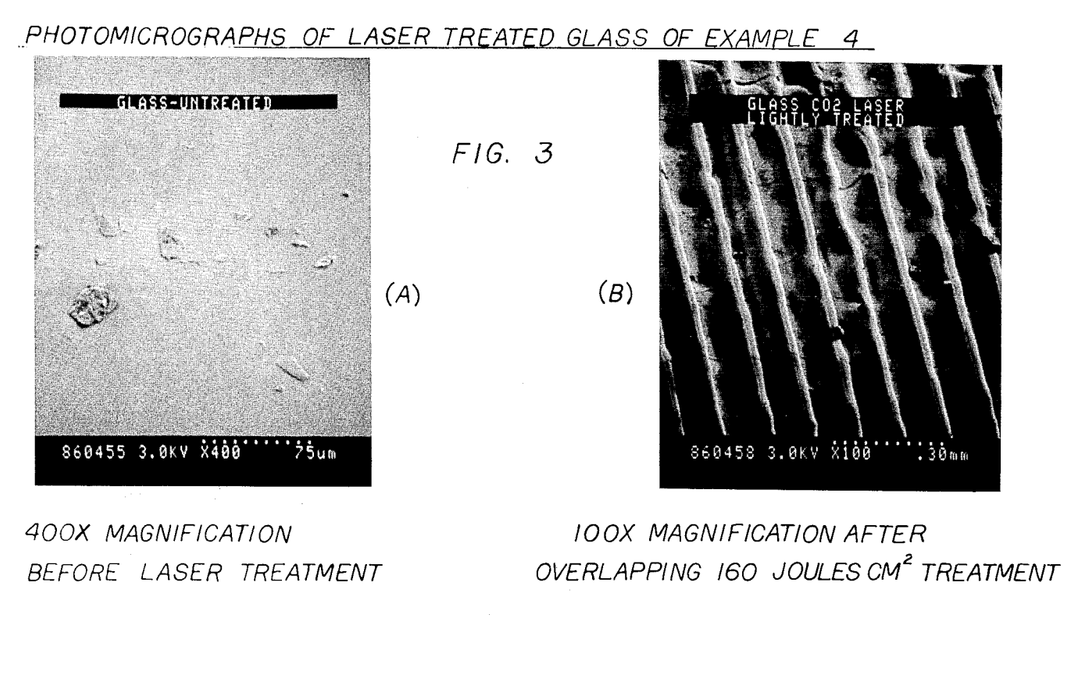
FIG. 3A–3D show photomicrographs of laser treated glass of Example 4.
Figure 4:
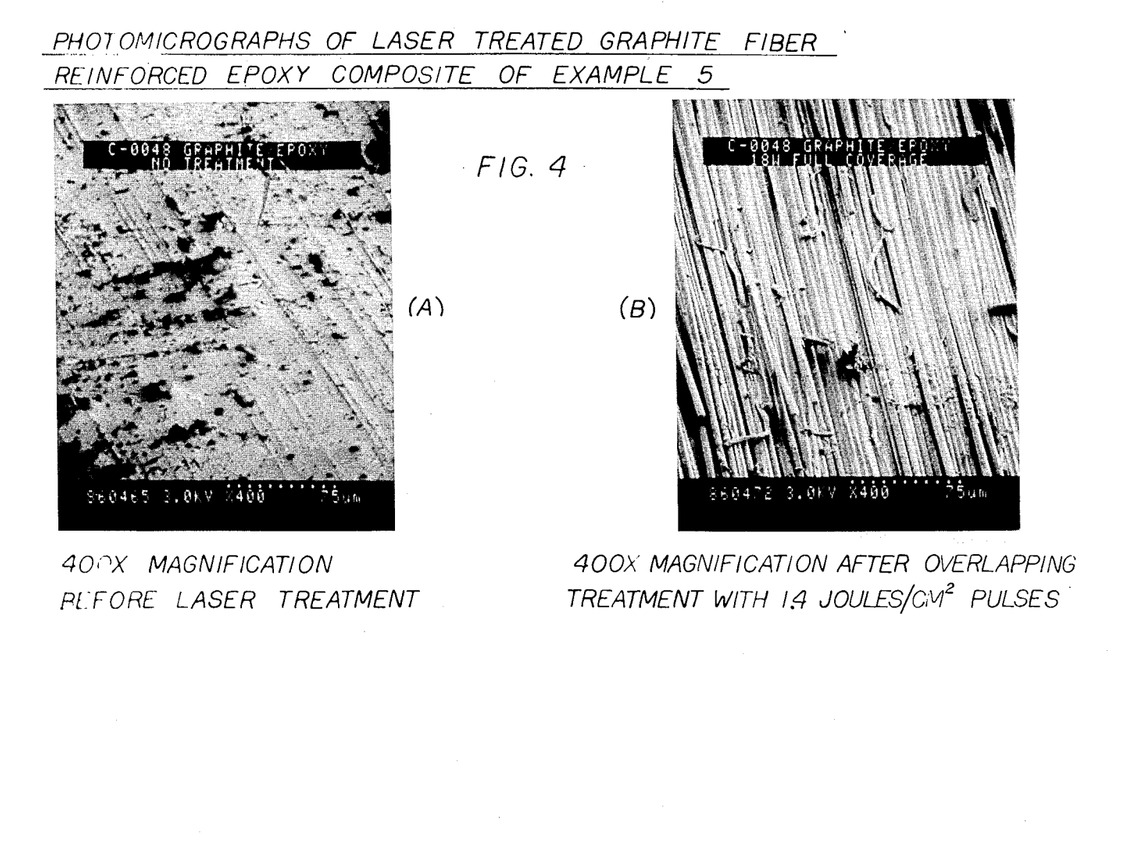
FIG 4A–4D show photomicrographs of laser treated graphite fiber reinforced epoxy composite of Example 5.

FIG. 2(a)-2(c) shows 400X magnification electron photomicrographs of silicone rubber: 2(a) before laser treatment; 2(b) after overall treatment with 1.4 joules/cm$^2$ per pulse of laser energy; and 2(c) after overall treatment with 5.5 joules/cm$^2$ per pulse of laser energy. FIG. 2(b) shows evidence of localized surface vaporization and localized formation of projections. FIG. 2(c) shows evidence of general overall surface vaporization and the resulting overall formation of projections.

EXAMPLE 3

The laser of Example 1 is replaced with a 100 watt (maximum) CO$_2$ continuous wave laser. The cylindrical lens is removed from the system and the laser beam is instead focused to a spot approximately 0.01 inches in diameter. The translation stage is adjusted to move the sample to be treated at a velocity of about 5 inches per second. The laser is adjusted for 50 watt output and thus the energy density of the laser beam directed to any one spot on the sample to be treated is about 160 joules/cm$^2$ to form projections on the glass substrate, the projections formed by evaporation of the glass substrate. The duration of exposure for any one spot to be treated is calculated to be about 2 milliseconds.

The above system is used to laser treat 1×4×⅛ inch panels of plate glass with overlapping coverage of the treated areas (about 150 percent coverage). The laser treated panels are bonded together with Hardman Kalex "Blue Urethane" two-part urethane adhesive with 0.5 percent, 0.020 inch diameter glass beads added to insure an evenly spaced "glue line." This adhesive is recommended by the manufacturer for use with glass and is rated as having a very good resistance to water.

The bonded panels are immersed into boiling water and examined periodically. After 24 hours of this exposure, none of the laser treated and bonded panels fell apart and could not be pulled apart by hand. For comparison, nonlaser treated panels bonded as above fell apart in the boiling water after 0.6 to 2 hours.

EXAMPLE 4

The system of Example 3 is used to laser treat 1×4×¼ inch panels of plate glass to form projections on the glass substrate, the projections formed by evaporation of the glass substrate. A stainless steel, General Motors approved automotive interior windshield mirror mount is bonded to the laser treated glass surface with Hardman "Orange" two-part epoxy adhesive (which is recommended by the manufacturer for bonding stainless steel to glass and is rated as having good water resistance) premixed with glass beads as in Example 3. A 1×4×1/16 inch carbon steel panel is bonded to the other side of the glass panel with the same adhesive as above.

The bonded assembly above is immersed into boiling water for 4.5 hours and then subjected to the industry specified torque test, i.e., a torque wrench is attached to the mirror mount and the torque required to peel the mirror mount away from the glass is measured. The mount could not be peeled away from the glass without actually breaking the glass (at about 150 inch pounds of torque) with failure occurring in the glass itself with no failure at the adhesive/glass interface. For comparison, a nonlaser treated glass panel was bonded, boiled and tested as above. The mirror mount cleanly peeled away from the glass at about 70 inch pounds of torque.

FIG. 3(a)-3(d) show electron photomicrographs of the laser treated glass panels: 3(a) before laser treatment at 400 X magnification; 3(b) after laser treatment at 100 X magnification showing ridge-like projections formed by evaporation of the glass substrate: 3(c) before laser treatment at 3,000 X magnification: and 3(d) after laser treatment at 4,000 X magnification showing even smaller projections formed by evaporation of the glass substrate.

EXAMPLE 5

The system of Example 4 is used to laser treat 1×4×⅛ inch panels of Ashland Chemical Co. "phase alpha" fiber glass reinforced sheet molding compound to expose glass fibers by evaporation of the polymer substrate, and the panels are bonded together with Hardman "blue" acrylic adhesive which is recommended by the manufacturer for bonding fiber reinforced plastics. The adhesive is premixed with 0.5 percent, 0.02 inch (0.51 mm) diameter glass beads and the adhesive is cured for 1 hour at room temperature and then at 250° F. (121° C.) for 1 hour. The bonded panels are tested for lap shear strength which averages 450 pounds per square inch (3.1 MPa) and the panel itself breaks without bond failure. Panels not laser treated but bonded as above have lap shear strengths averaging 160 pounds per square inch (1.1 MPa) and the bond fails at the interface between the adhesive and the panel.

EXAMPLE 6

The system of Example 1 is used to laser treat panels of solvent cleaned aircraft grade graphite fiber reinforced epoxy composite panels, 4×1×0.040 inches, (60 volume percent Hercules IM-6 graphite fibers, 40 volume percent epoxy resin) to expose graphite fibers by evaporation of the epoxy resin substrate. The treated panels are bonded together with Hardman blue/beige urethane adhesive, containing 0.5 percent, 0.020 inch glass spheres, and tested for lap shear strength using the ASTM D-1002 lap shear test. Another set of so-treated panels are bonded together with Hardman yellow epoxy adhesive containing 0.5 percent, 0.020 inch diameter glass spheres, and tested for lap shear strength using the same test. The test results are shown in Table II.

TABLE II

LAP SHEAR TESTING OF LASER TREATED GRAPHITE FIBER REINFORCED EPOXY COMPOSITE PANELS BONDED TOGETHER WITH A URETHANE ADHESIVE OR AN EPOXY ADHESIVE

| Laser Energy Density, Joules/cm$^2$ per Pulse | Lap Shear Strength, psi Urethane Adhesive | Lap Shear Strength, psi Epoxy Adhesive |
|---|---|---|
| 0.0 | 2,800 | 1,845 |
| 1.4 | 3,020 | — |
| 5.5 | 3,010 | 2,350 |

The data in Table II indicate that the laser treatment resulted in stronger bonds as indicated by the lap shear test for both adhesives at all laser energy densities per pulse studied but with a significant improvement in lap shear strength shown only for the epoxy adhesive. Using the urethane adhesive without laser treatment shows most of the bond failure at the interface between the adhesive and the panel, whereas with laser treatment the bond failure occurred mostly in the adhesive. Therefore, it is believed that the use of a stronger urethane adhesive would have resulted in even higher lap shear test results than shown in Table II.

FIG. 4(a)–4(d) show electron photomicrographs of the graphite fiber reinforced epoxy composite panels: 4(a) before laser treatment at 400 X magnification showing graphite fibers just under the surface of the epoxy resin substrate; 4(b) after overlapping treatment with 14 joules/cm$^2$ pulses at 400 X magnification showing graphite fibers exposed on one side by the evaporation of the epoxy resin substrate while the other side of the fibers remain embedded in the epoxy resin substrate; 4(c) after overlapping treatment with 5.5 joules/cm2 pulses at 400 X magnification showing graphite fibers exposed by the evaporation of the epoxy resin substrate; and 4(d) the same treatment as (c) above but at 3,000 X magnification showing graphite fibers exposed by the evaporation of the epoxy resin substrate.

EXAMPLE 7

The laser of Example 1 is replaced with a 46 watt continuous wave carbon dioxide laser having a wavelength output of 10.6 micrometers and is used to laser treat 1×4×0.125 inch panels of clear polycarbonate thermoplastic with 430 Joules/cm$^2$ per 5 millisecond duration to form projections on the polycarbonate substrate, the projections formed by evaporation of the polycarbonate substrate. The treated panels were bonded together (with a 1×1 inch overlap) with Hardman Purple 2-part epoxy adhesive mixed with 0.5% by weight of 0.004 inch diameter glass spacer beads, and cured for 30 minutes at 75 degrees F. plus 30 minutes at 150 degrees F. The so-bonded panels had a lap shear strength of 330 psi with about 75 percent of the bond failure in the adhesive itself. Untreated panels so-bonded had a lap shear strength of 250 psi with almost all of the bond failure between the adhesive and the surface panels.

EXAMPLE 8

The system of Example 1 is used to treat 1×4×0.125 inch panels of a black pigmented polymer blend believed to consist of polycarbonate, polybutylene terephthalate and methacrylate/butadiene/styrene (Xenoy 1102 from General Electric) with 50% overlapping 1.4 Joules/cm$^2$ per pulse laser treatment to form projections on the polymer substrate, the projections formed by evaporation of the polymer substrate. Identically treated panels are bonded together with Essex Chemical Company's Betaseal 553.02 polyurethane adhesive and then cured for 5 days at 72 degrees C. and 50% relative humidity. The lap shear strength of the so-bonded panels is 725 psi at 23 degrees C. with essentially 100% failure of the bond in the adhesive, and 1560 psi at 29 degrees below zero C. with about 84% failure of the bond in the adhesive. For comparison, untreated panels show a lap shear strength of 114 psi at 23 degrees C. with essentially 0% failure of the bond in the adhesive, and 1300 psi at 29 degrees below zero C. with about 22% failure of the bond in the adhesive.

Figure 5:
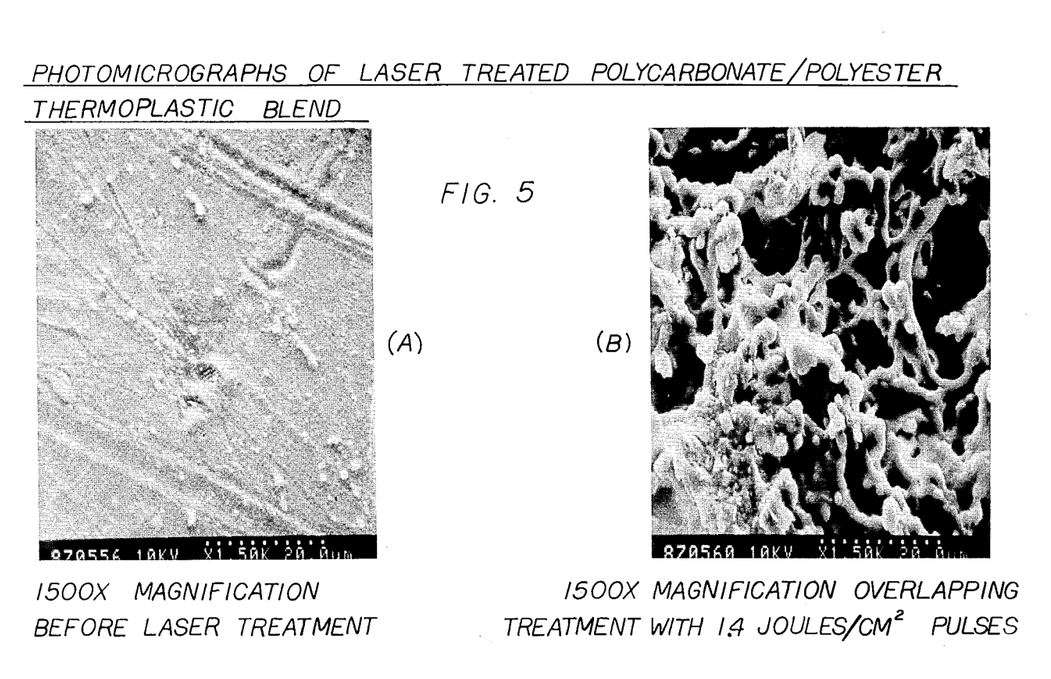
FIG. 5A–5B show photomicrographs of laser treated polymer blend of Example 8.

FIGS. 5(a)–5(b) shows 1500 X magnification electron photomicrographs of the Xenoy 1102: 5(a) before laser treatment and 5(b) after laser treatment as described above. FIG. 5(b) shows evidence of vaporization of the Xenoy 1102 polymer blend substrate and the resulting formation of projections.

EXAMPLE 9

The system of Example 7 is used to treat glass fiber reinforced Vectra brand liquid crystalline polymer panels with 50% overlapping 430 joules/cm$^2$ per 5 millisecond duration to form projections on the polymer substrate, the projections formed by evaporation of the Vectra substrate and to expose glass fibers, the glass fibers exposed by evaporation of the Vectra substrate. A silicone rubber strip is thermoset molded onto the treated portion of the Vectra panels and then peeled off to determine the peel strength of the bond between the silicone rubber strip and the Vectra panel. The peel strength is from 0.8 to 1.5 pounds per lineal inch. In contrast, untreated Vectra panels show a peel strength of 0.3 to 0.4 pounds per lineal inch.

The above will reveal the gist of the present invention that others can, by applying current knowledge, be readily adapted for various applications without admitting features that, from the standpoint of prior art, fairly constitute essential characteristics of the generic and specific aspects of this contribution to the art and, therefore, such adaptions should and are intended to be comprehended within the meaning and range or equivalence of the following claims.

What is claimed is:

1. A method for adhesively bonding a first body to a second body, the first body having a non-metallic substrate, the method comprising a step of pretreating an area of the first body; a step of applying an adhesive agent, the adhesive agent being applied to either the pretreated area of the first body, an area of the second body, or to both the pretreated area of the first body and an area of the second body; and then joining the pretreated area of the first body with the second body so that the adhesive agent is interposed between the pretreated area of the first body and the area of the second body, the improvement which comprises as the step of pretreating an area of the first body:

placing the first body in the path of an energy beam having a selected energy density for a duration effective to form projections on the non-metallic substrate of the first body, the projections formed substantially by evaporation of the non-metallic substrate of the first body.

2. The method of claim 1 wherein said energy beam is generated by a laser.

3. The method of claim 2 wherein said first body comprises a synthetic polymer substrate.

4. The method of claim 3 wherein the synthetic polymer substrate is a blend comprising polycarbonate resin and a polyester resin.

5. The method of claim 2 wherein the first body comprises a natural polymer substrate.

6. The method of claim 2 wherein the first body comprises a ceramic substrate.

7. The method of claim 6 wherein the ceramic substrate comprises glass.

8. A method for adhesively bonding a first body to a second body, the first body comprising a non-metallic substrate and a filler therein, the method comprising a step of pretreating an area of the first body; a step of applying an adhesive agent, the adhesive agent being applied to either the pretreated area of the first body, an area of the second body, or to both the pretreated area of the first body and an area of the second body; and then joining the pretreated area of the first body with the second body so that the adhesive agent is interposed between the pretreated area of the first body and the area of the second body, the improvement which comprises as the step of pretreating an area of the first body:

placing the first body in the path of an energy beam having a selected energy density for a duration effective to expose the filler of the first body substantially by evaporation of the non-metallic substrate of the first body.

9. The method of claim 8 wherein said energy beam is generated by a laser.

10. The method of claim 9 wherein the first body comprises a synthetic polymer substrate.

11. The method of claim 10 wherein the synthetic polymer substrate is a blend comprising polycarbonate resin and a polyester resin.

12. The method of claim 9 wherein the first body comprises a natural polymer substrate.

13. The method of claim 9 wherein the first body comprises a ceramic substrate.

14. The method of claim 13 wherein the ceramic substrate comprises a glass substrated.

15. A method for adhesively bonding a first body to a second body, the first body having a non-metallic substrate, the method comprising a step of pretreating an area of the first body and an area of the second body; a step of applying an adhesive agent, the adhesive agent being applied to either the pretreated area of the first body, the pretreated area of the second body, or to both the pretreated area of the first body and the pretreated area of the second body; and then joining the pretreated area of the first body with the pretreated area of the second body so that the adhesive agent is interposed between the pretreated area of the first body and the pretreated area of the second body, the improvement which comprises as the step of pretreating an area of the first body;

placing the first body in the path of an energy beam having a selected energy density for a duration effective to form projections on the non-metallic substrate of the first body, the projections formed substantially by evaporation of the non-metallic substrate of the first body.

16. The method of claim 15 wherein said energy beam is generated by a laser.

17. The method of claim 16 wherein the first body comprises a synthetic polymer substrate.

18. The method of claim 17 wherein the synthetic polymer substrate is a blend comprising polycarbonate resin and a polyester resin.

19. The method of claim 16 wherein the first body comprises a natural polymer substrate.

20. The method of claim 16 wherein the first body comprises a ceramic substrate.

21. The method of claim 20 wherein the ceramic substrate comprises glass.

22. A method for adhesively bonding a first body to a second body, the first body comprising a non-metallic substrate and a filler therein, the method comprising a step of pretreating an area of the first body and an area of the second body; a step of applying an adhesive agent, the adhesive agent being applied to either the pretreated area of the first body, the pretreated area of the second body, or to both the pretreated area of the first body and the pretreated area of the second body; and then joining the pretreated area of the first body with the pretreated area of the second body so that the adhesive agent is interposed between the pretreated area of the first body and the pretreated area of the second body, the improvement which comprises as the step of pretreating an area of the first body:

placing the first body in the path of an energy beam having a selected energy density for a duration effective to expose the filler of the first body substantially by evaporation of the non-metallic substrate of the first body.

23. The method of claim 22 wherein said energy beam is generated by laser.

24. The method of claim 23 wherein the first body comprises a synthetic polymer substrate.

25. The method of claim 24 wherein the synthetic polymer substrate is a blend comprising polycarbonate resin and a polyester resin.

26. The method of claim 23 wherein the first body comprises a natural polymer substrate.

27. The method of claim 23 wherein the first body comprises a ceramic substrate.

28. The method of claim 27 wherein the ceramic substrate comprises a glass substrate.

* * * * *

UNITED STATES PATENT AND TRADEMARK OFFICE
CERTIFICATE OF CORRECTION

PATENT NO. : 4,931,125

DATED : June 5, 1990

INVENTOR(S) : Curtis L. Volkmann et al

It is certified that error appears in the above-identified patent and that said Letters Patent is hereby corrected as shown below:

Column 1, line 29 "industries" should correctly read --industries'--.

Column 7, line 26 "test" should correctly read --test;--.

Column 7, line 29 "test" should correctly read --test;--.

Column 7, line 31 "test" should correctly read --test;--.

Column 7, line 33 "test" should correctly read --test;--.

Column 7, line 34 "test" should correctly read --test;--.
Column 7, line 38 "Example 4:" should correctly read --Example 4;--.
Column 8, line 49 "heatresistant" should correctly read --heat--.
Column 15, line 1 "said" should correctly read --the--.
Column 15, line 42 "substrated" should correctly read --substrate--.

Signed and Sealed this

Seventeenth Day of March, 1992

Attest:

HARRY F. MANBECK, JR.

*Attesting Officer*  *Commissioner of Patents and Trademarks*